May 21, 1940. E. G. LINDER Re. 21,458
MAGNETRON MODULATOR
Original Filed Jan. 31, 1936 3 Sheets-Sheet 1
Fig. I a.
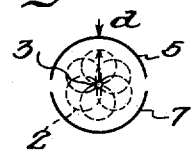
Fig. I b.
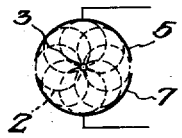
Fig. I c.
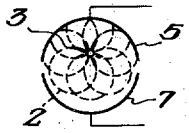
Fig. II.
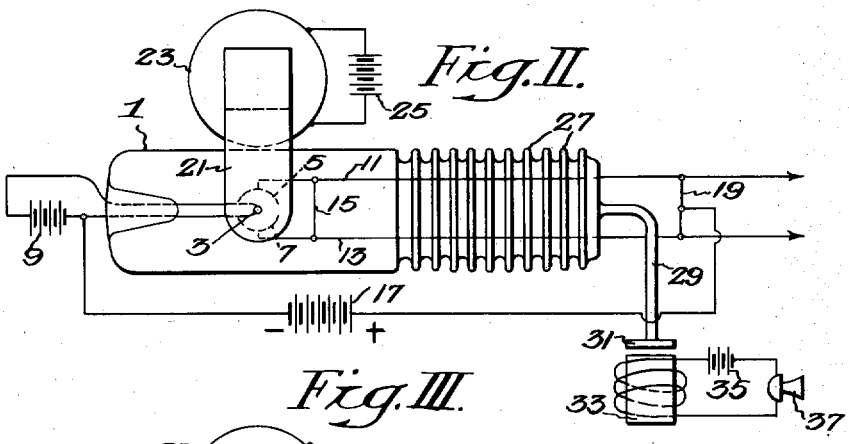
Fig. III.
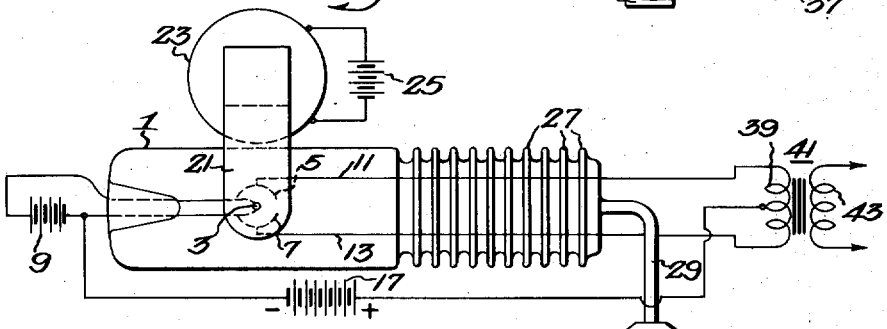
Fig. IV.
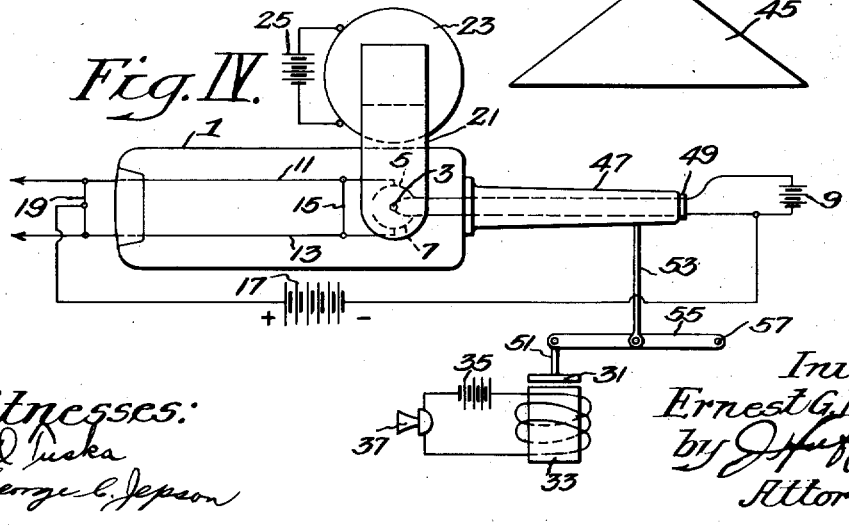
Witnesses:
C. D. Tuska
George E. Jepson
Inventor
Ernest G. Linder
by J. Huff
Attorney.

May 21, 1940. E. G. LINDER Re. 21,458
MAGNETRON MODULATOR
Original Filed Jan. 31, 1936 3 Sheets-Sheet 2
Fig. V.
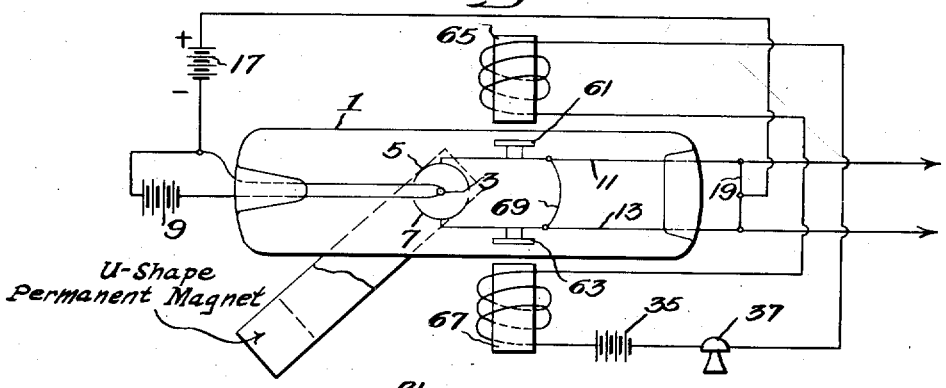
Fig. VI.
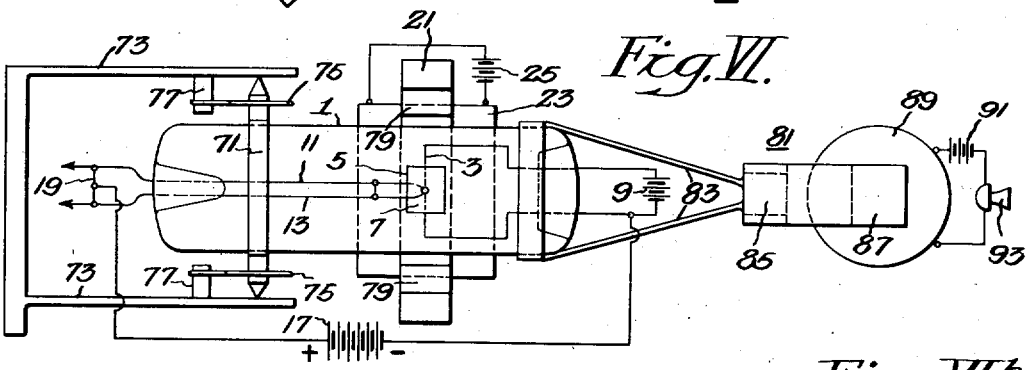
Fig. VI a.
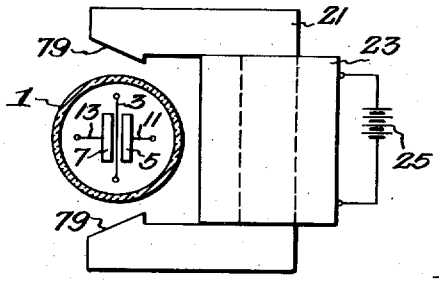
Fig. VI b.
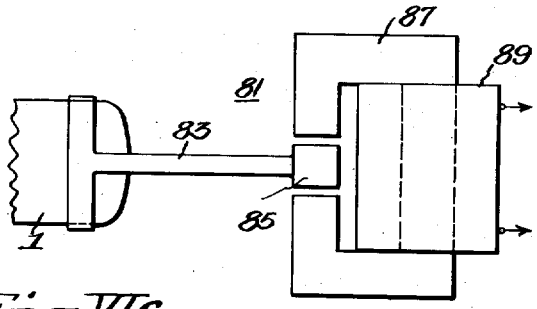
Fig. VI c.
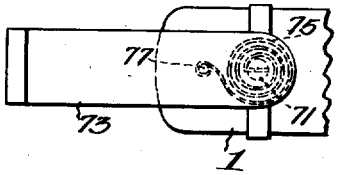
Witnesses:
C. D. Tuska
George E. Jepson
Inventor
Ernest G. Linder
by J. Huff
Attorney.

May 21, 1940. E. G. LINDER Re. 21,458
MAGNETRON MODULATOR
Original Filed Jan. 31, 1936 3 Sheets-Sheet 3
Fig. VII.
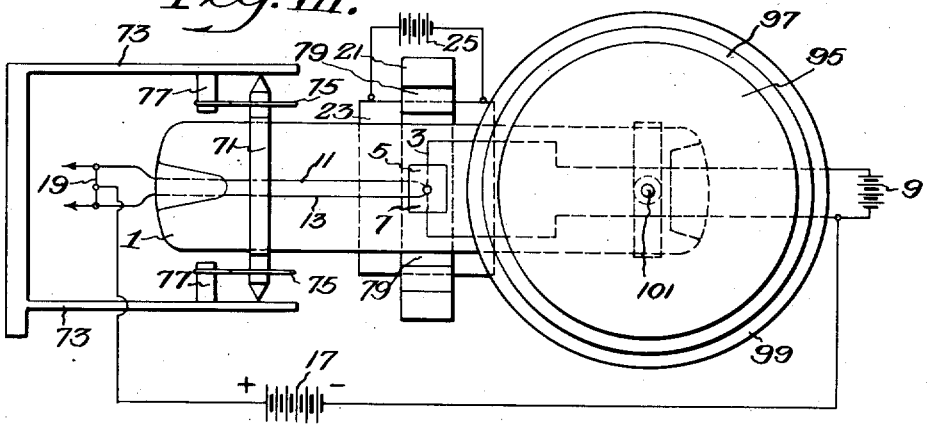
Fig. VIII.
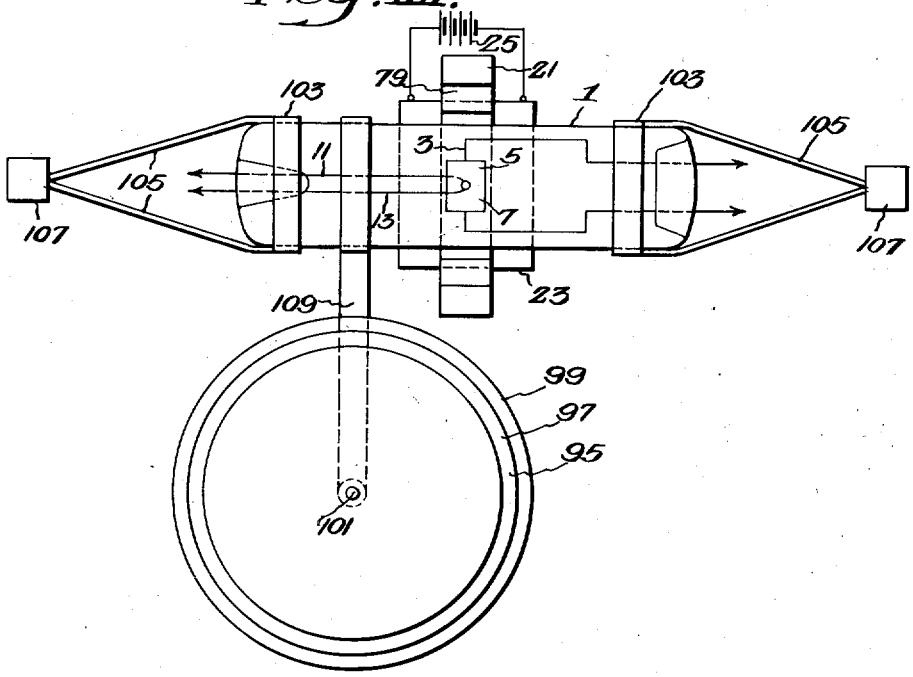
Witnesses:
C. D. Puska
George E. Jepson
Inventor
Ernest G. Linder
by
Attorney.

Reissued May 21, 1940

Re. 21,458

UNITED STATES PATENT OFFICE 21,458

MAGNETRON MODULATOR

Ernest G. Linder, Philadelphia, Pa., assignor to Radio Corporation of America, a corporation of Delaware Original No. 2,110,449, dated March 8, 1938, Serial No. 61,679, January 31, 1936. Application for reissue November 29, 1938, Serial No. 242,951

9 Claims. (Cl. 250—27.5)

My invention relates to a magnetron modulator. More particularly, my invention relates to the modulation of magnetrons by moving the anode with respect to the cathode, or by moving both electrodes with respect to the permanent magnetic field of the magnetron.

A magnetron is a thermionic tube including one or more anodes, a cathode, and a magnetic field. The lines of force of the field are substantially parallel to the cathode. The electrons from the cathode follow a curved path 2 which may be illustrated by Figure IA. The curved or circular path is due to the forces exerted on the electrons by the magnetic field, the anodes 5, 7, and the cathode 3.

In contrast to the magnetron, an ordinary triode has a cathode, grid and anode. No magnetic field is required. The electrons travel in a substantially straight line from the cathode to the anode. The number of electrons which reach the anode is normally determined by the spacing of the electrodes, and the relative grid, anode and cathode potentials.

I am aware of ordinary electron tubes in which the electrodes have been relatively movable. The movement of electrodes in such tubes has slightly varied the number of electrons reaching the anode, or the amplification factor if a triode is used. In the case of a diode or triode relatively small movement of the electrodes will have a secondary effect on tube operation.

The operation of a magnetron is especially suited to modulation by relative movement of electrodes or of electrodes with respect to the magnetic field. Since the magnetron is used at ultra-high frequencies, the capacity between the anodes is of primary importance. A slight relative movement will have a very large effect on the operating frequency. Furthermore, the circular path of the electrons makes it possible to completely stop the flow of electrons to one anode and to greatly increase the electron flow to the other.

Since the electron path is dependent upon the lines of force of the permanent magnetic field, the operation of the magnetron will be greatly affected by a slight relative movement of the electrodes with respect to the field. By way of example, the effect of moving the anodes with respect to the cathode is illustrated in Fig. IB and Fig. IC. Other types of relative movement will produce large changes in anode current. These changes are due to the characteristic magnetron operation.

One of the objects of my invention is to modulate a magnetron by changing the relative spacing of the cathode and anode electrodes.

Another object is to modulate a magnetron by moving the cathode and anode electrodes with respect to the magnetic field.

Another object is to change the relative spacing of the magnetron electrodes by means of a sound operated diaphragm.

Another object is to vary the operating frequency of a magnetron by moving its electrodes in a non-uniform field.

A further object is to operate a single magnetron as an oscillator, modulator and microphone.

A still further object is to vary the frequency of a magnetron oscillator by varying the interelectrode capacitance.

An additional object is to provide means whereby a magnetron may be made to generate audio frequency currents.

Reference is made to the accompanying drawings in which Figure IA, Figure IB, and Figure IC are illustrative of the operation of a magnetron embodying my invention, Figure II is a schematic diagram of a magnetron oscillator including modulation means, Figure III is an illustration of a magnetron modulated by a sound actuated diaphragm, Figure IV is a schematic diagram of a modification of Figure I, Figure V is a schematic diagram of a magnetron in which the anodes are moved with respect to cathode for frequency modulation, Figure VI is a schematic diagram of a magnetron in which the tube and electrodes are moved with respect to a magnetic field of non-uniform characteristics.

Figure VI*a* represents the anodes and the electro-magnet for producing the non-uniform field of Figure VI, Figure VI*b* is a plan view of the tube moving means shown in elevation in Figure VI.

Figure VI*c* is a plan view of the pivotal mounting and biasing spring shown in elevation in Figure VI.

Figure VII is a schematic diagram of a magnetron similar to Figure VI in which the tube moving means is a sound actuated diaphragm, and Figure VIII is a modification of the apparatus of Figure VII.

Throughout this specification similar reference numerals will be used to designate similar parts. In Figure II within an evacuated glass envelope 1 are mounted a cathode 3 and a pair of anodes 5, 7. The cathode is energized by a battery 9. The anodes are connected to a pair of lead wires 11, 13. A conductor 15 connects the lead wires. This conductor 15 and the anodes 5, 7 form a resonant circuit.

The lead wires 11, 13 may form a transmission line which may be connected to a dipole antenna or the like. The negative terminal of an anode battery 17 is connected to the cathode 3. The positive terminal of the anode battery is connected to a bridging conductor 19 which is suitably located on the leads 11, 13.

A U-shape magnetic core 21 is energized by a core 23 and a battery 25. Suitable jaws (not shown) are attached to the pole pieces of the core 21 to clamp the envelope 1. The magnetic lines of force between the pole pieces surround and are substantially parallel to the cathode 3. The arrangement thus far described may be operated as a magnetron oscillator.

A series of corrugations 27 are formed in the section of the envelope adjacent the lead-in of the transmission wires 11, 13. A connecting link 29 is fixed to the end of the envelope adjacent the corrugations 27. A magnetic armature 31 is fastened to the end of the link 29. An electromagnet 33 is suitably positioned with respect to the armature 31. The winding of the electromagnet is serially connected to a local battery 35 and a microphone 37.

The corrugations 27 offer sufficient flexibility to the envelope 1 to permit movement of the corrugated end of the envelope with respect to the portion clamped by the jaws attached to the magnetic core 21. A slight movement of the corrugated end which also supports the lead wires 11, 13 causes a substantial movement of the anodes 5, 7 with respect to the cathode 3. This movement results in a change of electron distribution represented by Figs. IB to IC. This change will modulate the normal electron flow.

While I have illustrated the electromagnet 33 and microphone 37 as a convenient means of flexing the tube to effect modulation, it should be understood that other means may be employed. For example, a sound actuated diaphragm, a mechanical movement for telegraphic signalling, or amplifiers may be used.

In Fig. III, the circuit is representative of a magnetron microphone-amplifier. In this device the magnetron operates as a microphone and also as an amplifier, although amplification is not essential. The leads 11, 13 are connected to the primary 39 of the push-pull transformer 41. The anode battery 17 is connected to the center tap of the primary 39. The secondary 43 of the transformer represents the output of the device.

In place of the electromagnetic motor of Figure II, a sound operated diaphragm 45 has been connected to the link 29. A movement of the diaphragm is transmitted through the link 29 to the flexible end of the envelope 1. The movement of the envelope in turn varies the relative position of anodes and cathode. This alters the electron distribution and hence the current flow through the primary 39.

A modification of Figure II is illustrated in Figure IV. This modification consists primarily in substituting a flexible metal section 47 in place of the corrugated glass section of envelope 1. As is known to those skilled in the art, a suitable metal may be attached to glass by sealing. The seal offers an airtight bond between the glass envelope 1 and the metal envelope 47. The free end of the metal envelope includes a glass insert 49 through which cathode leads may be brought.

In this modification, the cathode 3 is moved with respect to the anode electrodes 5, 7. The electro-magnetic motor device represented by armature 31 and magnet 33 has been connected through links 51, 53 and lever 55. The lever 55 is pivoted at 57. The single link 29 of Figure II may be used in place of the links and lever. Likewise, the diaphragm 45 of Figure III may be substituted for the electromagnetic motor.

The schematic circuit of Figure IV represents a combined magnetron oscillator, amplifier, and microphone. Instead of modulating the magnetron oscillator, the connection of this figure may be arranged similar to Figure III with a resulting microphone, push-pull amplifier action.

A further modification of Figure I is shown in Figure V. In this figure, the tube envelope 1 is entirely rigid. Instead of flexing the envelope, armatures 61, 63 are fastened to the lead wires 11, 13. The armatures are attracted or repelled by forces generated by the electromagnets 65, 67. Various movements of the anodes may be obtained by proper phasing of the exciting currents. The spaces between the armatures 61, 63 and the walls of the envelope are sufficient to permit free movement of the armatures. The bridging conductor 69, which may be employed in a magnetron oscillator, has sufficient length and flexibility to permit movement of the lead wires 11, 13.

Since the anodes 5, 7 are attached to the lead wires, they may be moved with respect to each other, or with respect to the cathode 3. If the magnetron is oscillating as a negative resistance device, the oscillatory frequency is inversely proportional to the capacity between the anodes; therefore, the movements of the anodes with respect to each other will substantially vary their capacities and the oscillatory frequency. If the magnetron is oscillating as an electronic oscillator, variations in relative anode spacing will vary the amplitude of oscillations. Thus, the magnetron oscillator of Figure V may be frequency modulated by impressing currents of the desired modulation frequency on the electromagnets 65, 67.

The arrangement of Figure V may be employed as microphone-amplifier instead of an oscillator. As an amplifier, the bridging conductor may be omitted. In both cases, the magnetic field is used. The electro-magnet structure 21, 23, 25 of Figure II is suitable for this purpose. A U shape permanent magnet may be used as shown in Fig. V.

Instead of using the arrangement of Figure V as a microphone-amplifier combination, this device may be used to generate audio frequency currents. In the generation of audio frequency currents the microphone 37 is omitted. A portion of the output currents, in the proper phase, is fed back to the exciting magnets 65, 67. The feedback currents may be amplified by a triode or the like. The frequency of the audio currents can be controlled by adjusting the natural frequency of vibration of the anodes 5, 7, armatures 61, 63 and lead wires 11, 13.

Figure VI represents a magnetron oscillator or amplifier which is moved as a whole by the modulation means. The anode and cathode electrodes are moved through a non-uniform magnetic field. Since the frequency of the oscillatory currents, or the amplification, depends upon the magnetic field strength, modulation will be effected by the relatively varying field. This arrangement is best adapted to the electronic mode of oscillation.

In Figure VI, the envelope 1 is suitably fastened to a pivot member 71. The pivot member 71 is pivotally supported by a yoke member 73. One or more biasing springs 75 are connected between fixed studs 77 on the yoke 73 and the pivot member to yieldably position the tube. These biasing springs may be helical in form similar to the hair spring on a watch.

The electro-magnetic system of this figure differs from the preceding figures. In the preceding figures, the pole pieces of the core 21 were of normal uniform shape and produced a substantially uniform field. The pole pieces 79 for this embodiment of my invention are illustrated in Figure VI*a*. The effect of the slanting pole pieces 79 is to produce a more dense magnetic field between the near points and less dense between the more widely spaced points. Movement of the anodes 5, 7 and cathode 3 in the non-uniform field will be equivalent to varying the field. This variation modulates the anode current or varies the frequency of oscillation.

In place of slanting pole pieces, various shape pole pieces may be used. For example, a V or inverted V-shape pole piece or a conical shape will have the required non-uniform field. Where the field has a rate of variation which is uniform with respect to movements on either side of the cathode, push-pull modulation may be produced.

The non-uniform field may be used for purposes other than modulation. For example, a permanent magnet may be substituted for the electrical one and the operating frequency of the magnetron varied by moving the magnet with respect to cathode and anode. Such a system lends itself to portability and simplicity of frequency adjustments.

One means for moving the magnetron of Figure VI is illustrated as an electro-magnetic driver 81. The driver is shown in plan view in Figure VI and in elevational view in Figure VI*b*. A pair of arms 83 are rigidly secured to the envelope 1. A magnetic armature 85 is secured to the ends of these arms by soldering, welding or the like.

The biasing springs 75 normally position the armature 85 in the center of the air gap of a magnetic core 87. The air gap is of sufficient width to permit the armature to freely oscillate within the gap when the magnet is energized. The energizing means includes the field coil 89, battery 91 and microphone 93. Amplifiers and lever actions may be employed in place of the direct drive shown.

A modification of Figure VI is illustrated in Figure VII. The essential difference between the apparatus of Figure VI and Figure VII is that the latter has a sound actuated diaphragm 95 to actuate the magnetron with respect to the non-uniform field. This field is produced by a magnet which has slanting pole pieces 79 similar to those shown in Figure VI*a*.

The diaphragm 95 may be a cone of suitable size. A flexible strip 97 of leather or cloth connects the cone to a rigid supporting ring 99. The center of the cone is connected to the movable end of the magnetron by a link 101. Sound impressed on the diaphragm actuates the magnetron which is pivotally mounted as previously described. This combination may be used as a microphone, microphone-amplifier, or oscillator, modulator and microphone.

In the embodiment of my invention shown in Figure VIII, the magnetron is mounted so that it may be rocked about the axis of envelope 1. A pair of metal rings 103 are clamped at the ends of the envelope 1. A pair of wires 105 are attached to each of the rings. These pairs of wires terminate in supports 107.

The pairs of wires and their connections act as a torsional balance. The suspended magnetron may be rocked about the axis of its envelope 1. In this figure, the batteries and connecting leads have been omitted. The magnetron may be connected and adjusted for generating, amplifying, oscillating, or modulating currents.

The means for rocking the tube may be a diaphragm, motor, or the like. For purposes of illustration, a sound actuated diaphragm 95 is shown. The diaphragm 95 is coupled to the envelope 1 by suitable links 101, 109. The force applied through these links rotates the magnetron about the axis of envelope 1. The field in the present instance is of the uniform type. Normally, the magnetic lines of force are substantially parallel to the cathode 3. As the magnetron is rocked back and forth, the relative angular relation between the electrodes, and the magnetic lines is varied. This variation alters the electron flow and thereby modulates the output.

Thus I have described, and illustrated several embodiments of my invention by means of which a magnetron may be used as a microphone, microphone-amplifier, modulated oscillator, a modulator, or audio frequency generator. Various elements of each of the several arrangements may be added to or substituted for elements of the other combinations. For example, a diaphragm may be substituted for the electromagnetic driving motors and vice versa.

I claim as my invention:

1. A magnetron including a cathode electrode and spaced from said electrode a pair of anode electrodes, means for creating a magnetic field whose lines of force surround and are substantially parallel to said cathode and an electromagnetic motor for varying the orientation of said electrodes by relative motion of said electrodes.

2. A magnetron including an evacuated envelope having a rigid section and a flexible section, an electron emissive cathode electrode supported by one of said sections, and a pair of anode electrodes supported by the other of said sections, means for establishing a magnetic field to thereby cause electrons emitted from said cathode to travel curved paths to said anodes, and means for flexing said flexible section so that said cathode and anodes may be moved relative to each other to thereby vary the number of electrons traveling between said cathode and anodes.

3. A magnetron including an evacuated envelope having a rigid section and a flexible metallic section, an electron emissive cathode electrode supported by one of said sections, means for establishing a magnetic field to thereby cause electrons emitted from said cathode to travel curved paths to said anodes, and a pair of anode electrodes supported by the other of said sections, and means for flexing said metallic section so that said cathode and anodes may be moved relative to each other to thereby vary the number of electrons traveling between said cathode and anodes.

4. A magnetron including an evacuated envelope having a rigid section and a flexible section, a cathode electrode supported by one of said sections, and a pair of anode electrodes supported by the other of said sections, means for establishing a magnetic field whose lines of force surround and are substantially parallel to said cathode, and means for moving said flexible section in accordance with desired signals so that at least one of said electrodes may be moved with respect to said magnetic field.

5. A magnetron amplifier including a cathode electrode and spaced from said cathode electrode a pair of anode electrodes, means for creating a magnetic field whose lines of force surround and are substantially parallel to said cathode, said field having such a value that the electrons which are released from said cathode move substantially tangentially to said anode electrodes, means for moving said anode electrodes with respect to said cathode electrode in accordance with a signal so that the electron current to one of said anode electrodes is increased by a movement which decreases the electron current to the other of said anode electrodes, whereby a current is produced whose variations correspond to said signal.

6. A device for producing modulated ultra high frequency oscillations comprising a magnetron oscillator including a cathode electrode and spaced therefrom a pair of anode electrodes, means for producing a magnetic field whose lines of force surround and are substantially parallel to said cathode electrode, and means for producing relative movements between said electrodes to vary the characteristics of said oscillations in accordance with said movements.

7. A magnetron including an evacuated envelope having a rigid section and a flexible section, an electron emissive cathode electrode supported solely by one of said sections, and a pair of anode electrodes supported solely by the other of said sections, means for establishing a magnetic field perpendicular to the path of electron flow to thereby cause electrons emitted from said cathode to travel curved paths to said anodes, and means for flexing said flexible section so that said cathode and anodes may be moved relative to each other to thereby vary the number of electrons traveling between said cathode and anodes.

8. A magnetron microphone-oscillator modulator comprising an evacuated envelope having a rigid section and a flexible section, an electron emissive cathode supported solely by one of said sections and a pair of anode electrodes supported solely by the other of said sections, means for establishing a magnetic field parallel to the axis of said cathode to thereby establish ultra high frequency oscillations, and means for flexing said flexible section in accordance with sound pressure variations so that said oscillations are modulated in accordance with said variations.

9. A magnetron including a cathode electrode and spaced from said electrode a pair of anode electrodes, means for creating a magnetic field whose lines of force surround and are substantially parallel to said cathode and means for varying the orientation of said electrodes by relative motion of said electrodes.

ERNEST G. LINDER.